(12) United States Patent
Vircks (10) Patent No.: US 8,550,260 B1
(45) Date of Patent: Oct. 8, 2013

(54) AIRCRAFT CONTROL PANEL ASSEMBLY

(75) Inventor: Bradley J. Vircks, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1040 days.

(21) Appl. No.: 12/567,199

(22) Filed: Sep. 25, 2009

(51) Int. Cl.
*A47F 7/00* (2006.01)

(52) U.S. Cl.
USPC .............................................. 211/26; 211/208

(58) Field of Classification Search
USPC ............... 211/26, 26.2, 192, 189, 86.01, 103, 211/117, 208; 361/679.02, 679.61, 724; 244/129.1
See application file for complete search history.

(56) References Cited

U.S. PATENT DOCUMENTS

| | | | | |
|---|---|---|---|---|
| 1,015,907 A * | 1/1912 | Ryder | | 220/246 |
| 1,619,312 A * | 3/1927 | Peters | | 312/280 |
| 2,819,692 A * | 1/1958 | Johnson et al. | | 109/50 |
| 3,666,338 A * | 5/1972 | Russell | | 312/215 |
| 3,885,846 A * | 5/1975 | Chuang et al. | | 312/306 |
| 4,871,202 A * | 10/1989 | Friedrichs et al. | | 292/169 |
| 4,896,777 A * | 1/1990 | Lewis | | 211/41.17 |
| 4,922,734 A * | 5/1990 | Iannucci | | 70/58 |
| 4,959,979 A * | 10/1990 | Filipow et al. | | 70/58 |
| 4,964,286 A * | 10/1990 | Poyer | | 70/58 |
| 5,146,769 A * | 9/1992 | Smith | | 70/14 |
| 5,156,027 A * | 10/1992 | Reusch | | 70/14 |
| 5,312,005 A * | 5/1994 | Odell | | 211/189 |
| 5,683,001 A * | 11/1997 | Masuda et al. | | 211/26 |
| 5,709,359 A * | 1/1998 | Riley | | 248/201 |
| 5,786,995 A | 7/1998 | Coleman | | |
| 5,992,808 A * | 11/1999 | Morrow | | 248/222.52 |
| 6,279,754 B1 * | 8/2001 | Hoss et al. | | 211/26 |
| 6,349,837 B1 * | 2/2002 | Serban | | 211/26 |
| 6,481,582 B1 * | 11/2002 | Rinderer | | 211/26 |
| 6,682,282 B2 * | 1/2004 | Allen | | 411/353 |
| 6,789,685 B2 * | 9/2004 | Dean et al. | | 211/26 |
| 7,032,862 B2 * | 4/2006 | Landes et al. | | 244/129.1 |
| 7,108,135 B2 * | 9/2006 | Park | | 206/711 |
| 7,118,483 B2 * | 10/2006 | Beadell et al. | | 463/46 |
| 7,810,653 B2 * | 10/2010 | Schmidtke et al. | | 211/26 |
| 8,020,714 B2 * | 9/2011 | Miller et al. | | 211/134 |
| 2006/0291155 A1 * | 12/2006 | Chen et al. | | 361/683 |

* cited by examiner

*Primary Examiner* — Darnell Jayne
*Assistant Examiner* — Stanton L Krycinski
(74) *Attorney, Agent, or Firm* — Donna P. Suchy; Daniel M. Barbieri (57) ABSTRACT

An aircraft control panel assembly for attachment to an equipment rail of an aircraft. The aircraft control panel assembly includes a chassis assembly including at least one bore formed therein, the bore being at a first locking location. A retaining assembly, includes: a) at least one spring loaded pin assembly positioned within a portion of the at least one bore of the chassis assembly, the pin assembly including a pin element and a spring element arranged and constructed to be positionable within a pocket of an equipment rail of the aircraft, a spring element of the pin assembly biasing the pin element toward the pocket; b) a link member having a first end operably attached to the pin element; and, c) a pin retraction mechanism comprising a slider assembly for manipulating the link member so as to retract the pin element from the pocket. At least one positioning element is secured to the chassis at, at least one positioning location. The positioning element is arranged and constructed to be positionable within a receiving slot of the equipment rail. When the positioning element is positioned within the receiving slot of the equipment rail and the pin element is engaged within the pocket of the equipment rail, the chassis is attached to the equipment rail.

19 Claims, 8 Drawing Sheets

AIRCRAFT CONTROL PANEL ASSEMBLY

BACKGROUND OF THE INVENTION

1. Field of the Invention

The present invention relates generally to aircraft control panels, and more particularly to an improved aircraft control panel assembly that includes a mounting system hidden behind the front panel of the control panel assembly.

2. Description of the Related Art

Aircraft manufacturers desire to develop a very 'clean' look on their new designs for flight decks. The established and virtually exclusive means of mounting equipment involves the use of Dzus-type fasteners on the exposed and visibly prominent panel face, creating substantial visual clutter. With repeated servicing these Dzus-type fasteners have their paint badly chipped and the panel edges are often damaged causing leakage of internal illumination because personnel are manipulating them with screwdrivers.

An example of a showing of the use of Dzus-type fasteners with aircraft panel assemblies is illustrated in U.S. Pat. No. 5,786,995 entitled "Avionics System Having Access Through Hinged Display and Control Panel."

SUMMARY OF THE INVENTION

In a broad aspect, the present invention is an aircraft control panel assembly for attachment to an equipment rail of an aircraft. The aircraft control panel assembly includes a chassis assembly including at least one bore formed therein, the bore being at a first locking location. A retaining assembly, includes: a) at least one spring loaded pin assembly positioned within a portion of the at least one bore of the chassis assembly, the pin assembly including a pin element and a spring element arranged and constructed to be positionable within a pocket of an equipment rail of the aircraft, a spring element of the pin assembly biasing the pin element toward the pocket; b) a link member having a first end operably attached to the pin element; and, c) a pin retraction mechanism comprising a slider assembly for manipulating the link member so as to retract the pin element from the pocket. At least one positioning element is secured to the chassis at, at least one positioning location. The positioning element is arranged and constructed to be positionable within a receiving slot of the equipment rail. When the positioning element is positioned within the receiving slot of the equipment rail and the pin element is engaged within the pocket of the equipment rail, the chassis is attached to the equipment rail. Preferably, the aircraft control panel assembly includes two bores formed at opposite sides of the chassis assembly. The retaining assembly comprises two spring loaded pin assemblies, each being associated with a respective one of the two bores.

The pin retraction mechanism can be easily cosmetically covered. This mounting method is sufficiently robust for relatively lightweight control panel equipment.

DETAILED DESCRIPTION OF THE INVENTION

Figure 1:
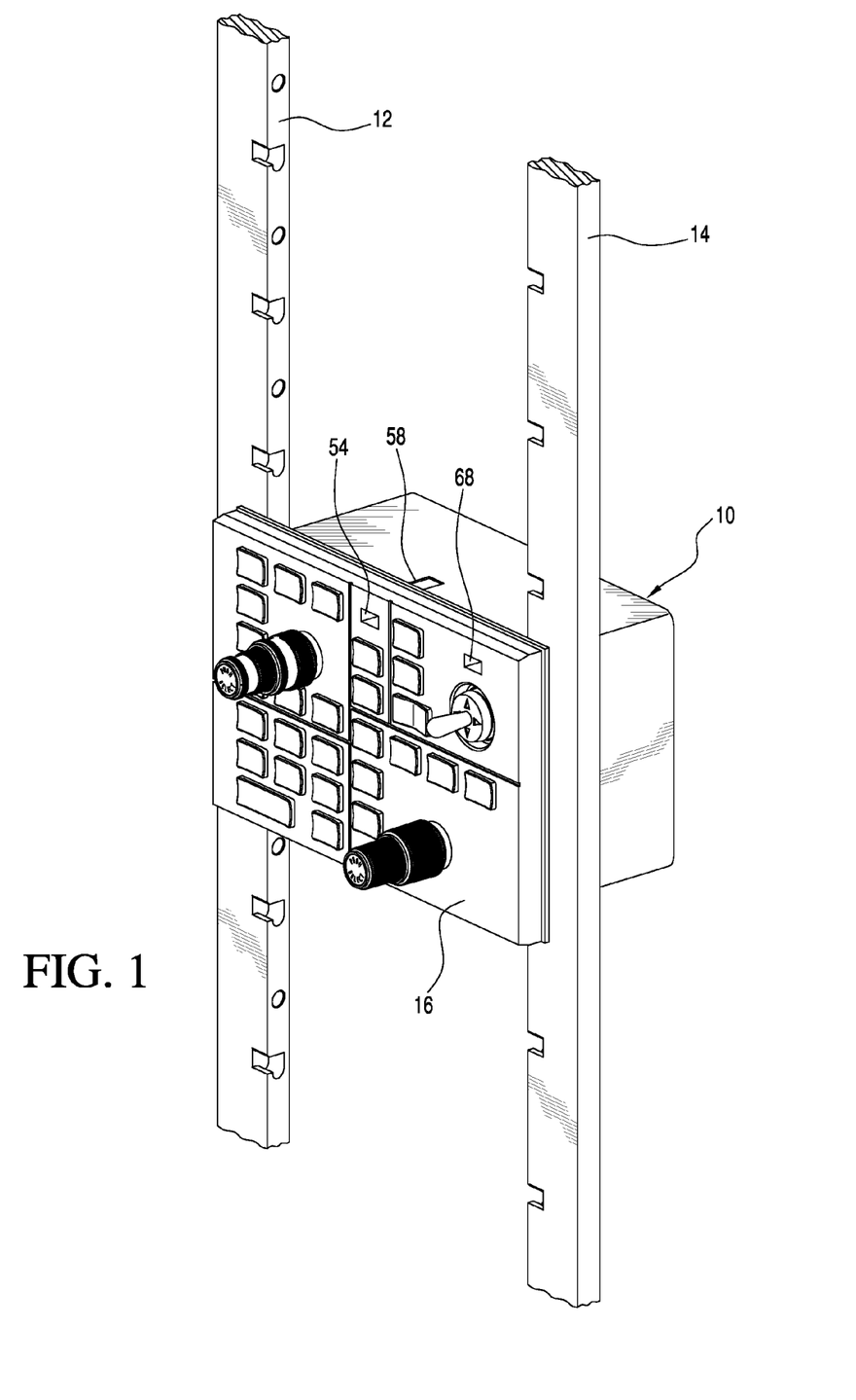
FIG. 1 is a front, perspective view of the aircraft control panel assembly mounted to an equipment rail of an aircraft, in accordance with the principles of the present invention.
Figure 2:
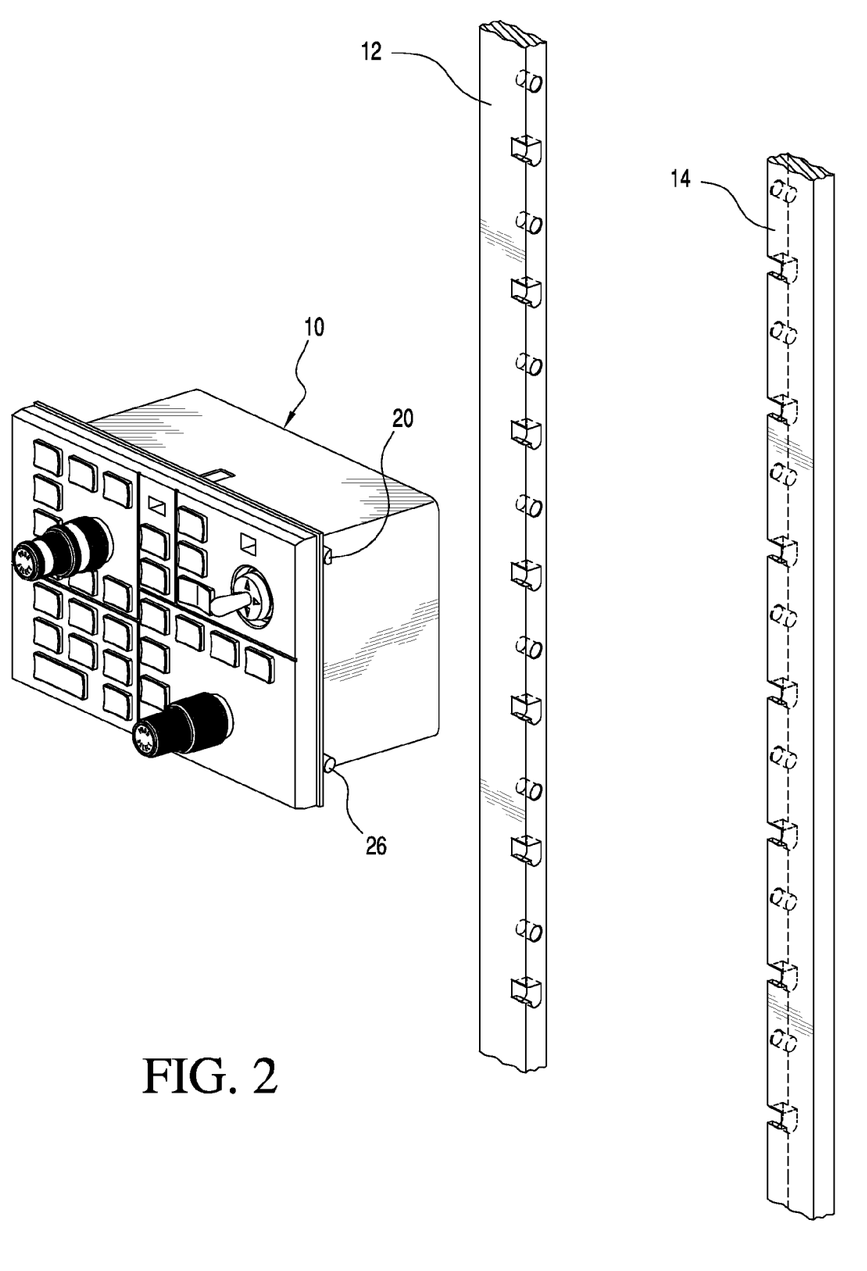
FIG. 2 is a front, perspective view of the aircraft control panel assembly detached from an equipment rail of an aircraft.
Figure 3:
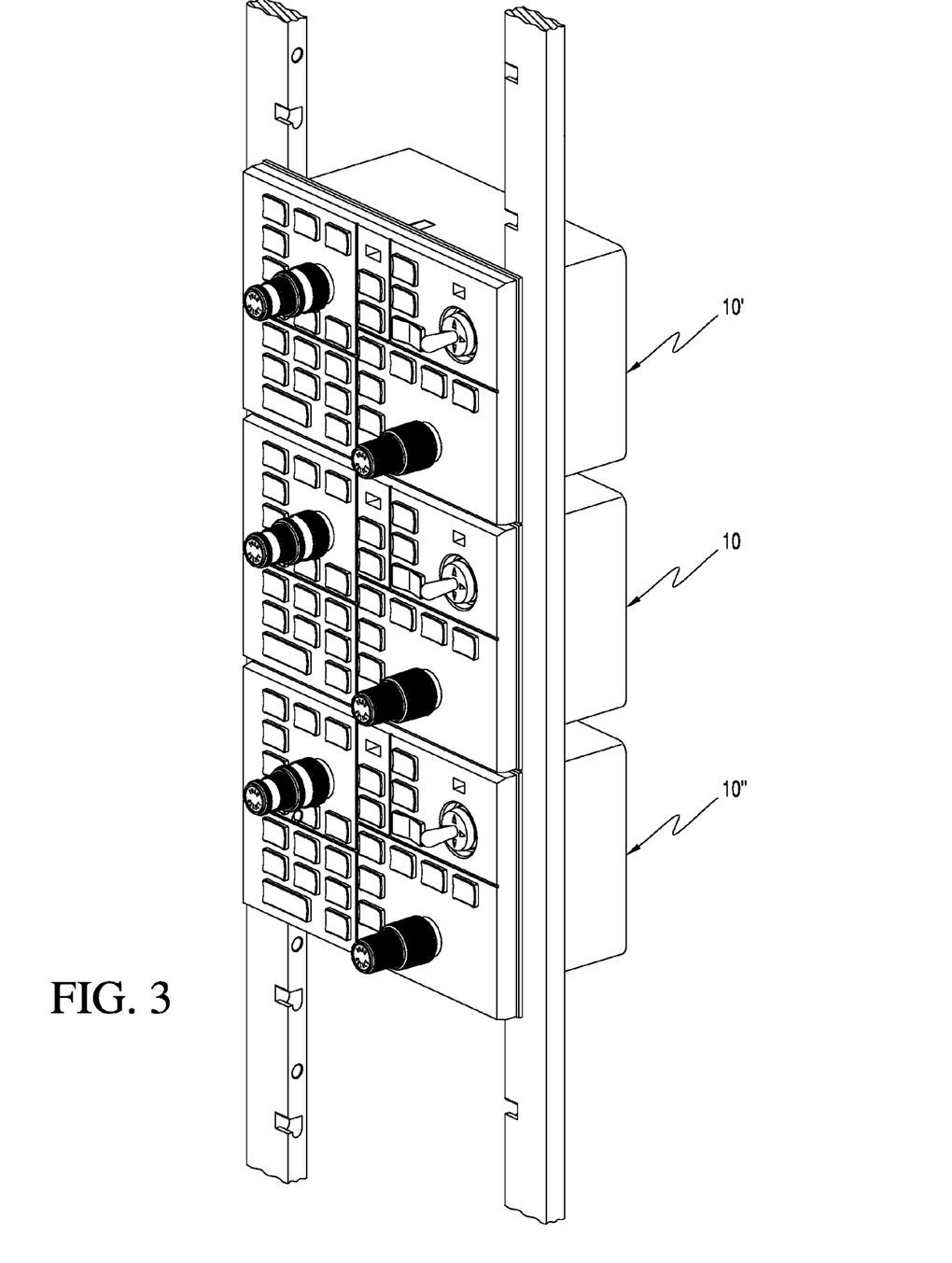
FIG. 3 shows multiple aircraft control panel assemblies mounted to the equipment rail.

Referring now to the drawings and the characters of reference marked thereon, FIG. 1 illustrates the aircraft panel assembly of the present invention, designated generally as 10, attached to equipment rails 12, 14 of an aircraft. The retaining assembly (discussed below in detail) is in a location behind a front panel 16 of the aircraft panel assembly 10 and thus enhances the look of the aircraft control panel assembly 10. As shown in FIG. 2, the aircraft panel assembly 10 is attached by a positioning elements 26 and pin elements 20 located on both sides of the assembly 10. As shown in FIG. 3, various aircraft panel assembles 10, 10', 10" can be stacked along the rails 12, 14.

Figure 4:
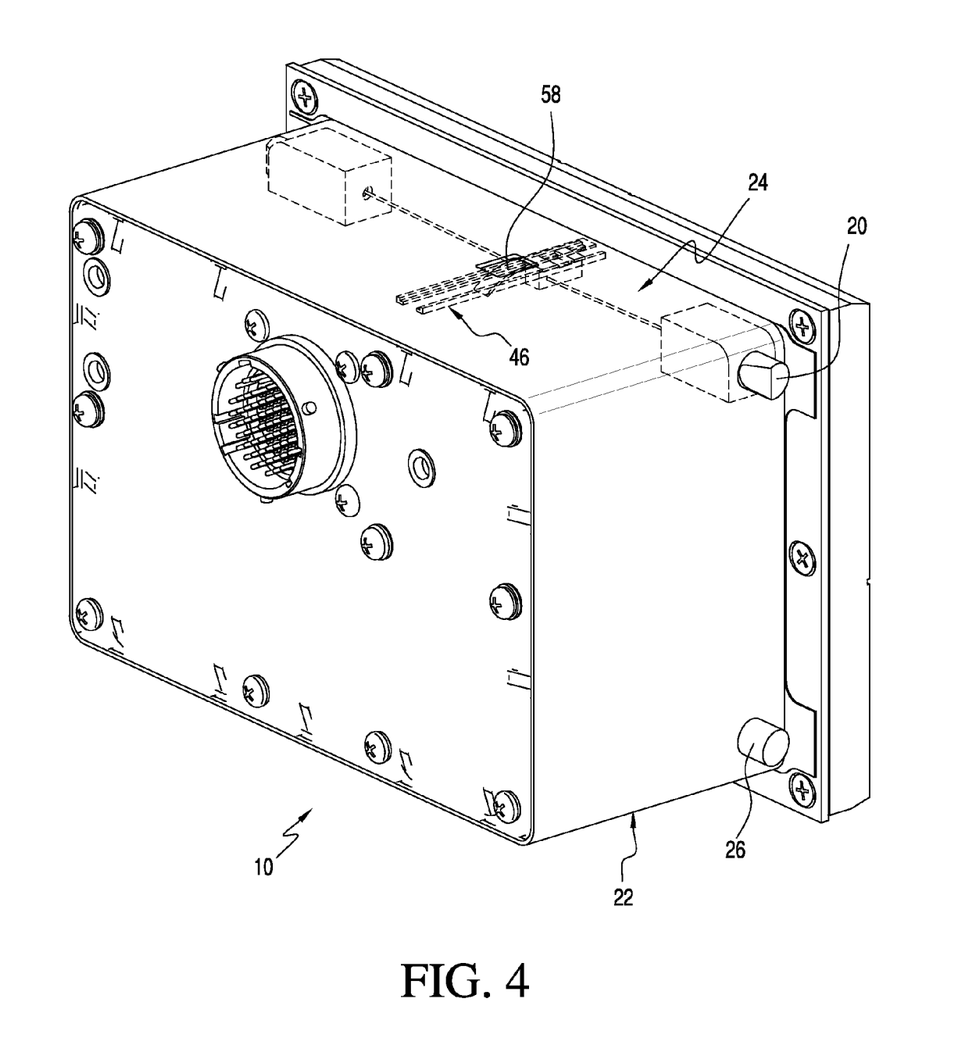
FIG. 4 is a rear, perspective view of an aircraft control panel assembly.
Figures 5, 6, 7:
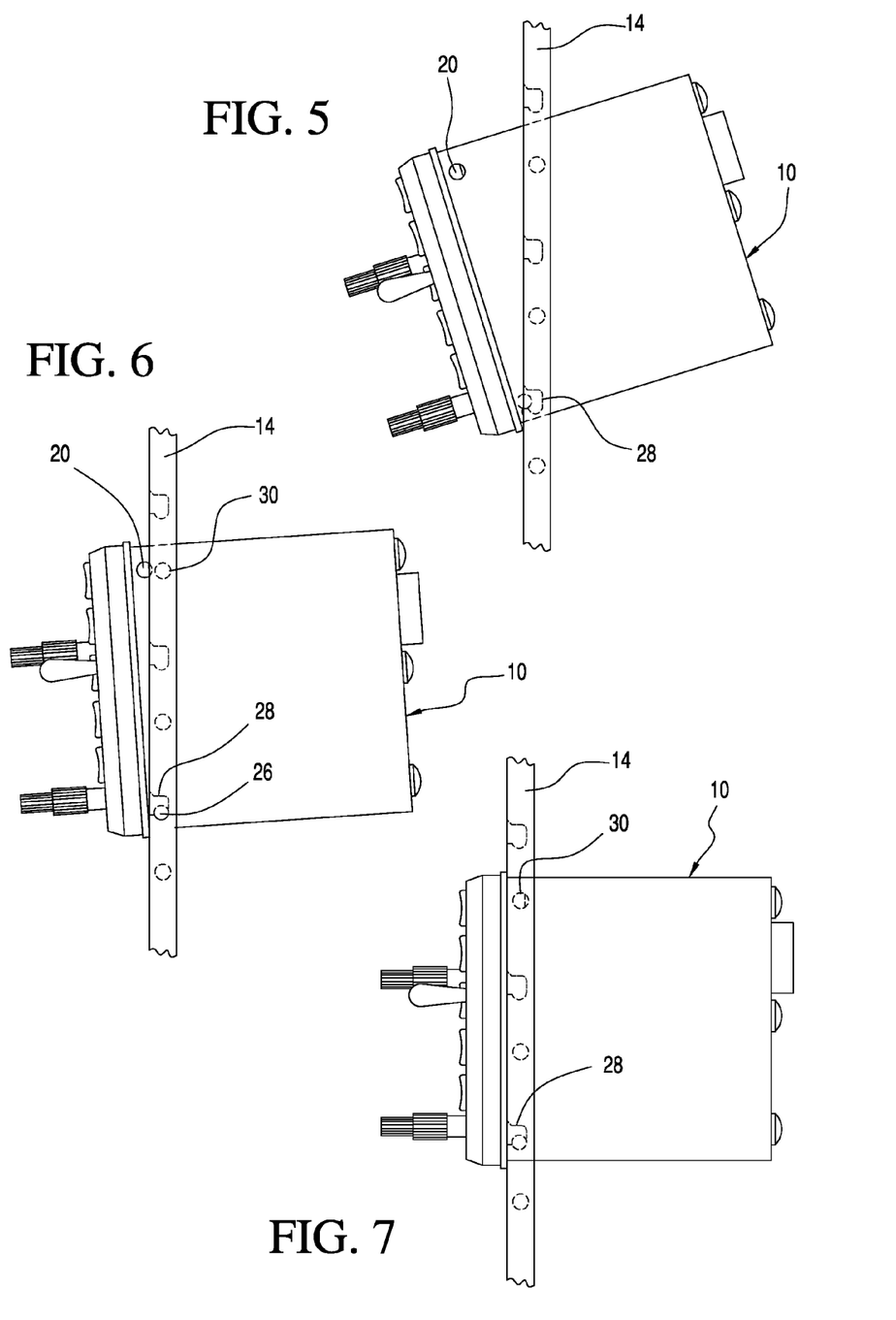
FIG. 5 is a side view of a first step in the mounting of a control panel assembly on an equipment rail.
FIG. 6 is a side view of a second step in the mounting of a control panel assembly on an equipment rail.
FIG. 7 is a side view showing the control panel assembly mounted on an equipment rail.

Referring now to FIG. 4, it can be seen that the aircraft control panel assembly 10 includes a chassis assembly, designated generally as 22; a retaining assembly, designated generally as 24; and positioning'elements 26. As shown in FIG. 5, in a first step in the mounting of a control panel assembly 10 on the equipment rails 12, 14, the positioning elements 26 are secured into position within receiving slots 28 of the rails 12, 14. Then, as shown in FIG. 6, the top of the aircraft control panel assembly 10 is rotated toward the rails 12, 14. Finally, as shown in FIG. 7, the pin elements 20 are aligned with respective pockets 30 in the rails 12, 14 and extended (as will be explained in detail below).

Figure 8:
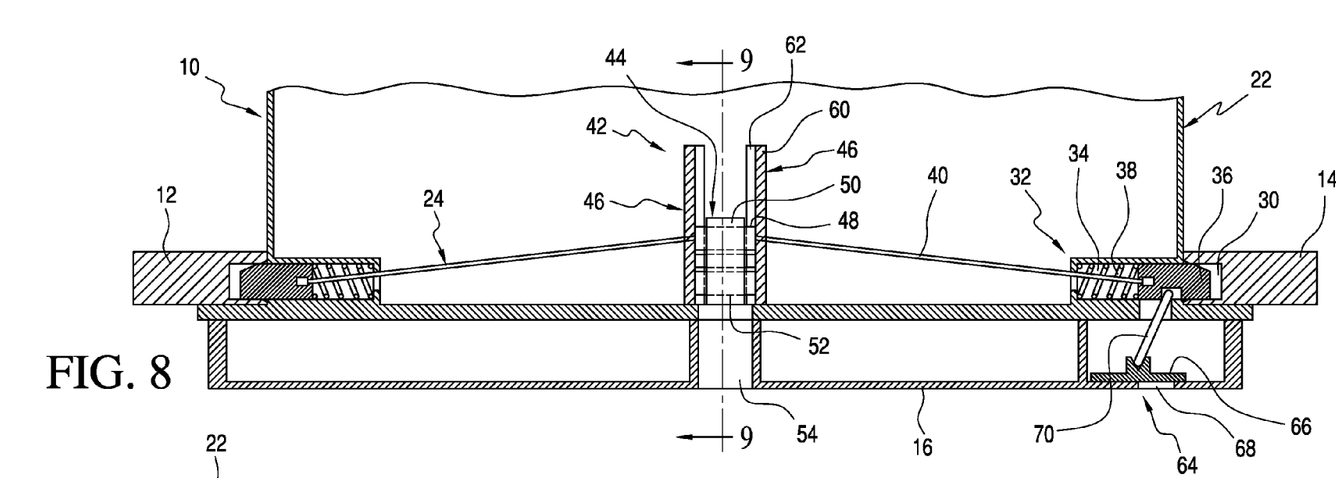
FIG. 8 is a top view, partially in cross-section, of an aircraft control panel assembly in a mounted position on an equipment rail.
Figure 9:
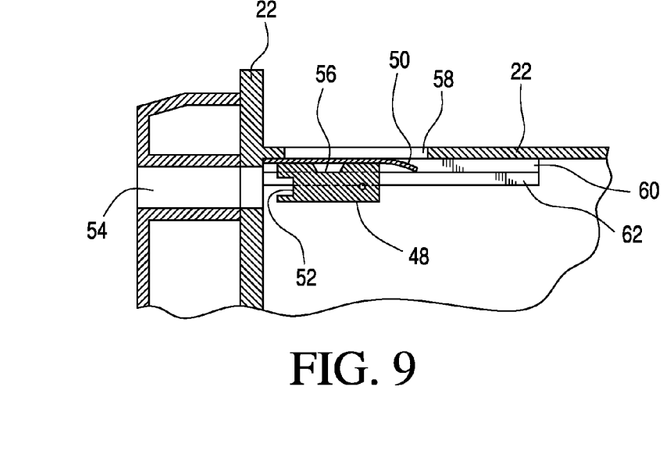
FIG. 9 is a view taken along line 9-9 of FIG. 8.
Figure 10:
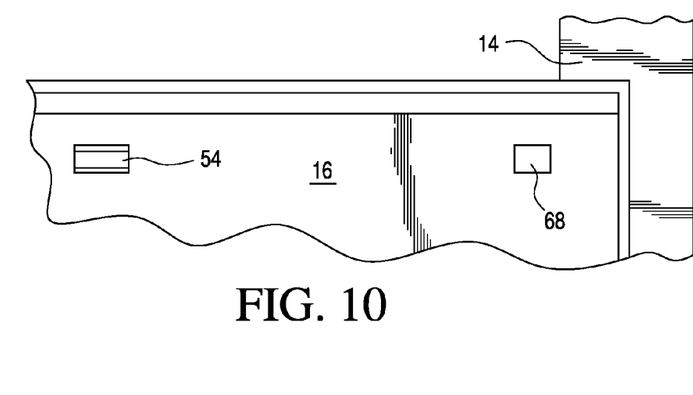
FIG. 10 is front view of a portion of the aircraft control panel assembly in the region of the visual indicator window and slider element accessing opening.

Referring now to FIGS. 8-10, the inside of the aircraft control panel assembly 10 can be viewed. The retaining assembly 22 includes two spring loaded pin assemblies, each designated generally as 32, positioned within portions of respective bores 34 formed within the chassis assembly 22. Each pin assembly 32 includes a pin element 36 and a spring element 38 arranged and constructed to be positionable within a pocket 30 of the equipment rail 14. The spring element 38 of the pin assembly 32 biases the pin element 36 toward the pocket 30. A cable (i.e. link member) 40 has a first end operably attached to the pin element 36. As used herein the term "spring element" is defined broadly to include any suitable biasing element.

A pin retraction mechanism 42 includes a slider assembly 44 for manipulating the cable 40 so as to retract the pin element 36 from the pocket 30. A rail assembly 46 of the pin retraction mechanism 42 is secured to the chassis assembly 22. The slider assembly 44 includes a slider element 48 slideably engageable with the rail assembly 46. A slider assembly spring 50 is securely attached to the rail assembly 46. The slider element 48 is operatively connected to the cable 40 so as to push the cable 40 forward for retracting the pin element 36 from the pocket 30 when the slider element 48 is slid along the rail assembly 46 a preselected distance from the slider assembly spring 50.

The slider element 48 includes a front face 52 aligned with a slider element access opening 54 in the chassis assembly 22 for access to the operator in depressing the slider element 48. The front face 52 may be depressed by, for example, a standard screwdriver or other conveniently accessible device such as a pencil. The opening 54 may be easily cosmetically covered.

Figure 11:
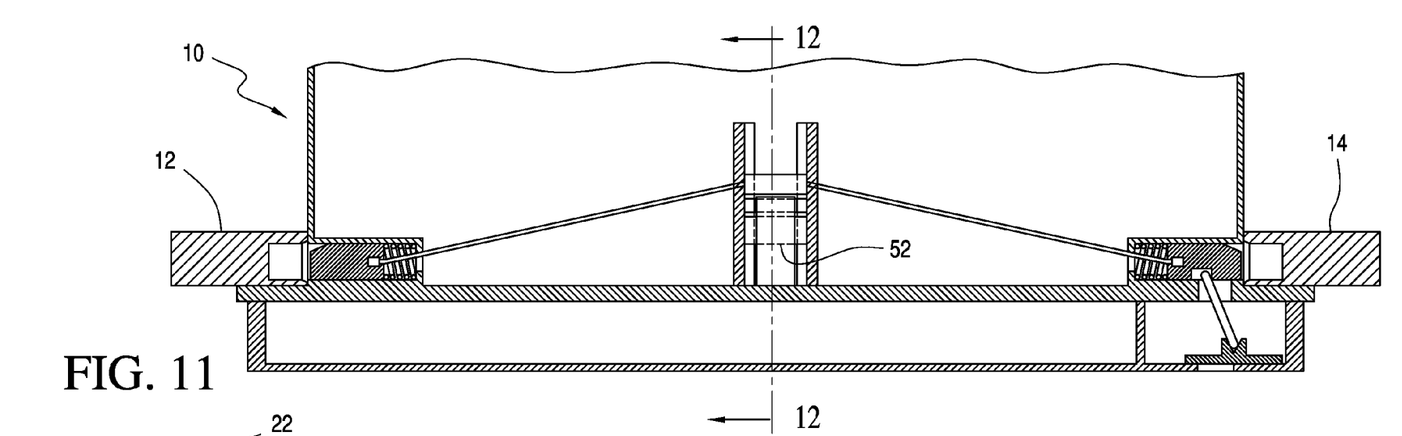
FIG. 11 is a top view, partially in cross-section, of an aircraft control panel assembly with the pin element shown retracted from the pocket of an equipment rail.
Figure 12:
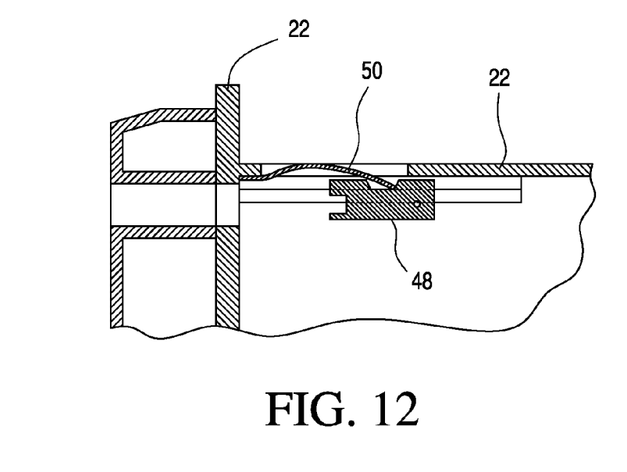
FIG. 12 is a view taken along line 12-12 of FIG. 11.
Figure 13:
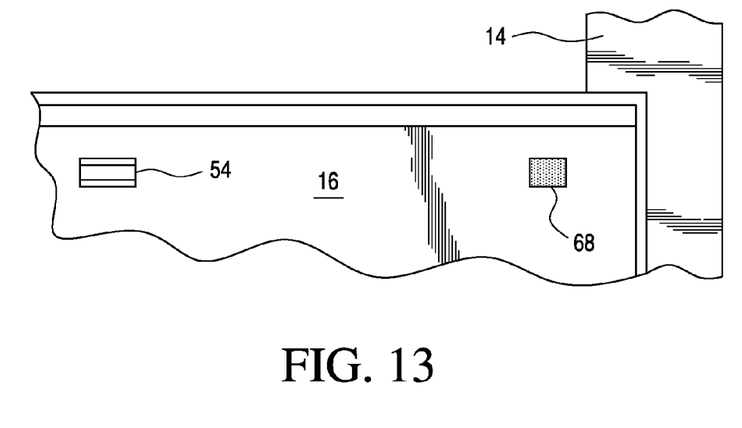
FIG. 13 is front view of a portion of the aircraft control panel assembly in the region of the visual indicator window and slider element accessing opening, in the position shown in FIGS. 11 and 12.

The slider element 48 includes a depression 56 formed in a spring engaging portion thereof for securing the slider assembly spring 50 in a pin disengaged, retracted position. This retracted position is illustrated in FIGS. 11-13. As can be seen in FIG. 12, in this retracted position the end of the spring 50 is secured within the depression 56. The spring 50 may be manipulated via a spring access opening 58 in the chassis assembly 22, the manipulation thereof providing disengagement of the slider assembly spring 50 from the depression 56. The rail assembly 46 may include, for example two opposing L-shaped rails, each including a vertical portion 60 and a horizontal portion 62.

The final chassis attachment to the rails (i.e. progressing from the position shown in FIG. 6 to the position shown in FIG. 7) is accomplished by 'snapping' the top edge into place. The chamfered edges (best seen in FIG. 4) of the pin elements come into contact with the rails and the cam action forces the pins into the chassis bores as the chassis top edge is pressed to the rails. The pin elements then snap outward into the rail pockets as the chassis comes to its final position. The cable (or other linkage mechanism) is intended to allow the retractable pin elements to move inward without forcing the slider element 48 to move.

Installation of the aircraft control panel assembly 10 into the equipment rails 12, 14 begins only if the release mechanism (i.e. slide assembly spring 50) is disengaged, placing the slider element 48 closest to the front panel 16 which results in the pin elements 36 being extended as shown in FIGS. 8 and 9. In this way, the installer does not have to access the release mechanism to put the control panel assembly 10 into the rails 12, 14. Thus, installation of unit into the aircraft is 'tool free'.

A visual indicator mechanism, designated generally as 64, is preferably included for indicating the open/closed state of the retaining assembly 24. The visual indicator mechanism 64 includes a sliding indicator 66 slidable over a window 68 in the chassis assembly 22. A lever 70 is operably engageable with the sliding indicator 66 and the pin element 36 to slidably position the sliding indicator 66 over the window 68 so as to allow a viewer to determine the open/closed state. The indicator mechanism 64 provides assurance to the installer that the pin elements 36 are fully engaged and installation is completed. The face of the sliding indicator 66 may have, for example, color designations indicative of this status. Although the embodiment shown in this figure shows one visual indicator mechanism 64, there may be visual indicator mechanisms on both sides of the aircraft control panel assembly 10 to indicate if one, both, or neither pin element 36 is fully engaged.

Figure 14:
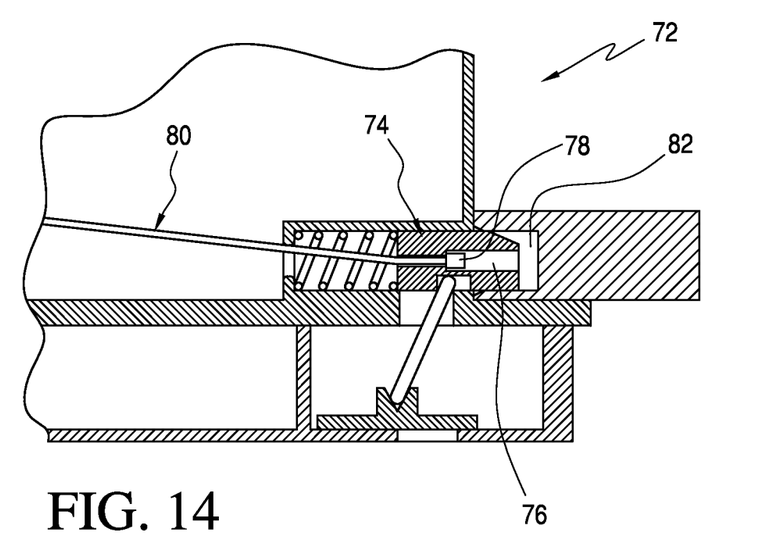
FIG. 14 is a top view, partially in cross-section, of a portion of an alternative aircraft control panel assembly in a mounted position on an equipment rail, this alternative aircraft control panel assembly including a pin element having an elongated opening for slidably engaging the end of a link member.

Other embodiments and configurations may be devised without departing from the spirit of the invention and the scope of the appended claims. For example, although the link member has been described as a flexible cable, it may be some other type of linkage such as a rigid draw-bar linkage or formed sheet metal. Additionally, other types of cable configurations can be utilized. For example, referring now to FIG. 14, another embodiment of the present invention is illustrated, designated generally as 72, in which the pin element 74 comprises an elongated opening 76 for slideably retaining a link member end 78 of the link member 80 to provide retraction of the pin element 74 from the pocket 82. In this instance a shoulder of the cable end 78 of the cable 80 engages a shoulder in the pin element 74, the pin element shoulder defining a bottom of the elongated opening 76 to provide retraction of the pin element 74.

Figure 15:
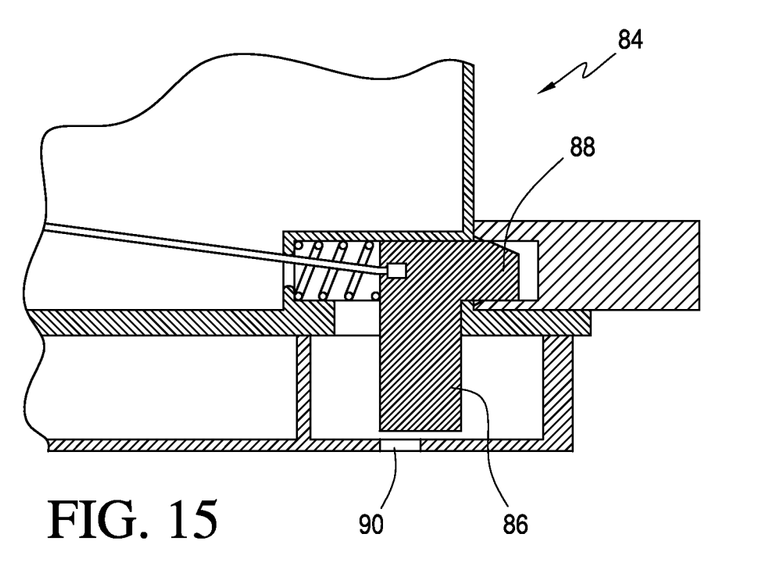
FIG. 15 illustrates the alternative use of a sliding indicator integrated with the pin element The same elements or parts throughout the figures of the drawings are designated by the same reference characters, while equivalent elements bear a prime designation.

Referring now to FIG. 15 another embodiment of the present invention is illustrated, designated generally as 72, utilizing an alternative visual indicator mechanism. In this embodiment a sliding indicator 86 is integrated or securely fastened to the pin element 88. As in the previous embodiments the sliding indicator 86 is slidable over a window 90 in the chassis assembly so as to allow a viewer to determine the open/closed state.

What is claimed is:

1. An aircraft control panel assembly for attachment to an equipment rail of an aircraft, comprising:
    a) a chassis assembly including at least one bore formed therein, said bore being at a first locking location;
    b) a retaining assembly, comprising:
        i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
        ii. a link member having a first end operably attached to said pin element, said link member comprising a flexible member; and,
        iii. a pin retraction mechanism comprising a slider assembly for manipulating said link member so as to retract said pin element from said pocket; and,
    c) at least one fixed positioning element secured to said chassis at, at least one positioning location, said at least one fixed positioning element being arranged and constructed to be positionable within a receiving slot of said equipment rail, wherein when said fixed positioning element is positioned within said receiving slot of said equipment rail and wherein said pin element is engaged within said pocket of said equipment rail, said chassis is attached to said equipment rail, and wherein said pin element comprises a chamfered edge for providing the capability of said aircraft control panel assembly to be installed without the use of a tool, said chamfered edge being on only one side of one end of the pin element.

2. The aircraft control panel assembly of claim 1, wherein said link member comprises a cable.

3. The aircraft control panel assembly of claim 1, wherein said chassis assembly comprises a front panel, said retaining assembly being in a location behind said front panel to enhance the look of the aircraft control panel assembly.

4. The aircraft control panel assembly of claim 1, further comprising a visual indicator mechanism for indicating the open/closed state of said retaining assembly.

5. An aircraft control panel assembly for attachment to an equipment rail of an aircraft, comprising:
   a) a chassis assembly including at least one bore formed therein, said bore being at a first locking location;
   b) a retaining assembly, comprising:
     i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
     ii. a link member having a first end operably attached to said pin element; and,
     iii. a pin retraction mechanism comprising a slider assembly for manipulating said link member so as to retract said pin element from said pocket;
   c) at least one fixed positioning element secured to said chassis at, at least one positioning location, said at least one fixed positioning element being arranged and constructed to be positionable within a receiving slot of said equipment rail, wherein when said fixed positioning element is positioned within said receiving slot of said equipment rail and wherein said pin element is engaged within said pocket of said equipment rail, said chassis is attached to said equipment rail, and wherein said pin element comprises a chamfered edge for providing the capability of said aircraft control panel assembly to be installed without the use of a tool, said chamfered edge being on only one side of one end of the pin element; and,
   d) a visual indicator mechanism for indicating the open/closed state of said retaining assembly, said visual indicator mechanism, comprising:
     a sliding indicator slidable over a window in said chassis assembly; and,
     a lever operably engageable with said sliding indicator and said pin element to slidably position said sliding indicator over said window so as to allow a viewer to determine said open/closed state.

6. The aircraft control panel assembly of claim 1, wherein
   a) said at least one bore comprises two bores formed at opposite sides of said chassis assembly; and,
   b) said retaining assembly comprises two spring loaded pin assemblies, each being associated with a respective one of said two bores.

7. An aircraft control panel assembly for attachment to an equipment rail of an aircraft, comprising:
   a) a chassis assembly including at least one bore formed therein, said bore being at a first locking location;
   b) a retaining assembly, comprising:
     i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
     ii. a link member having a first end operably attached to said pin element; and,
     iii. a pin retraction mechanism comprising a slider assembly for manipulating said link member so as to retract said pin element from said pocket; and,
   c) at least one fixed positioning element secured to said chassis at, at least one positioning location, said at least one fixed positioning element being arranged and constructed to be positionable within a receiving slot of said equipment rail, wherein when said fixed positioning element is positioned within said receiving slot of said equipment rail and wherein said pin element is engaged within said pocket of said equipment rail, said chassis is attached to said equipment rail, and wherein said pin element comprises a chamfered edge for providing the capability of said aircraft control panel assembly to be installed without the use of a tool, said chamfered edge being on only one side of one end of the pin element;
wherein said pin retraction mechanism, comprises:
   a rail assembly secured to said chassis assembly; and,
   said slider assembly, comprises:
     i. a slider element slideably engageable with said rail assembly; and,
     ii. a slider assembly spring securely attached to said rail assembly, wherein said slider element is operatively connected to said link member so as to push the link member forward for retracting said pin element from said pocket when said slider element is slid along said rail assembly a preselected distance from said slider assembly spring.

8. The aircraft control panel assembly of claim 7, wherein said slider element comprises a front face aligned with a slider element access opening in said chassis assembly for access to the operator in depressing said slider element.

9. The aircraft control panel assembly of claim 8, wherein said slider element includes a depression formed in a spring engaging portion thereof for securing said slider assembly spring in a pin disengaged, retracted position,
   wherein said spring is manipulated via a spring access opening in said chassis assembly, the manipulation thereof providing disengagement of said slider assembly spring from said depression.

10. The aircraft control panel assembly of claim 1, wherein said pin element comprises an elongated opening for slideably retaining a link member end of said link member to provide said retraction of said pin element from said pocket.

11. An aircraft control panel assembly for attachment to an equipment rail of an aircraft, comprising:
   a) a chassis assembly including at least one bore formed therein, said bore being at a first locking location;
   b) a retaining assembly, comprising:
     i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
     ii. a link member having a first end operably attached to said pin element; and,
     iii. a pin retraction mechanism comprising a slider assembly for manipulating said link member so as to retract said pin element from said pocket;
   c) at least one fixed positioning element secured to said chassis at, at least one positioning location, said at least one fixed positioning element being arranged and constructed to be positionable within a receiving slot of said equipment rail, wherein when said fixed positioning element is positioned within said receiving slot of said equipment rail and wherein said pin element is engaged within said pocket of said equipment rail, said chassis is attached to said equipment rail, and wherein said pin element comprises a chamfered edge for providing the capability of said aircraft control panel assembly to be installed without the use of a tool, said chamfered edge being on only one side of one end of the pin element; and, d) a visual indicator mechanism for indicating the open/closed state of said retaining assembly, said visual indicator mechanism, comprising:
   a sliding indicator securely fastened to said pin element, said sliding indicator being slidable over a window in said chassis assembly so as to allow a viewer to determine said open/closed state.

12. An aircraft control panel assembly for attachment to an equipment rail of an aircraft, comprising:
a) a chassis assembly including at least one bore formed therein, said bore being at a first locking location;
b) a retaining assembly, comprising:
   i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
   ii. a link member having a first end operably attached to said pin element; and,
   iii. a pin retraction mechanism comprising a slider assembly for manipulating said link member so as to retract said pin element from said pocket;
c) at least one fixed positioning element secured to said chassis at, at least one positioning location, said at least one fixed positioning element being arranged and constructed to be positionable within a receiving slot of said equipment rail, wherein when said fixed positioning element is positioned within said receiving slot of said equipment rail and wherein said pin element is engaged within said pocket of said equipment rail, said chassis is attached to said equipment rail, and wherein said pin element comprises a chamfered edge for providing the capability of said aircraft control panel assembly to be installed without the use of a tool, said chamfered edge being on only one side of one end of the pin element; and,
d) a visual indicator mechanism for indicating the open/closed state of said retaining assembly, said visual indicator mechanism, comprising:
   a sliding indicator integrated with said pin element, said sliding indicator being slidable over a window in said chassis assembly so as to allow a viewer to determine said open/closed state.

13. An aircraft control panel assembly for attachment to an equipment rail of an aircraft, comprising:
a) a chassis assembly including at least one bore formed therein, said bore being at a first locking location, said chassis assembly comprising a front panel;
b) a retaining assembly, comprising:
   i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
   ii. a cable having a first end operably attached to said pin element; and,
   iii. a pin retraction mechanism comprising a slider assembly for manipulating said cable so as to retract said pin element from said pocket,
      wherein said retaining assembly is in a location behind said front panel to enhance the look of the aircraft control panel assembly; and,
c) at least one fixed positioning element secured to said chassis at, at least one positioning location, said at least one fixed positioning element being arranged and constructed to be positionable within a receiving slot of said equipment rail, wherein when said fixed positioning element is positioned within said receiving slot of said equipment rail and wherein said pin element is engaged within said pocket of said equipment rail, said chassis is attached to said equipment rail, and
wherein said at least one bore comprises two bores formed at opposite sides of said chassis assembly, and said retaining assembly comprises two spring loaded pin assemblies, each being associated with a respective one of said two bores, and wherein said pin element comprises a chamfered edge for providing the capability of said aircraft control panel assembly to be installed without the use of a tool, said chamfered edge being on only one side of one end of the pin element.

14. The aircraft control panel assembly of claim 13, further comprising a pair of visual indicator mechanisms for indicating the open/closed state of each side of said retaining assembly.

15. The aircraft control panel assembly of claim 13, further comprising a pair of visual indicator mechanisms for indicating the open/closed state of each side of said retaining assembly, said visual indicator mechanism, comprising:
a) a pair of sliding indicators slidable over a pair of windows in said chassis assembly; and,
b) a pair of levers, each operably engageable with a respective one of sliding indicators and a respective pin element to slidably position each said sliding indicator over its associated window so as to allow a viewer to determine said open/closed state.

16. The aircraft control panel assembly of claim 13, wherein said pin retraction mechanism, comprises:
a) a rail assembly secured to said chassis assembly; and,
b) said slider assembly, comprises:
   i. a slider element slideably engageable with said rail assembly; and,
   ii. a slider assembly spring securely attached to said rail assembly, wherein said slider element is operatively connected to said link member so as to push the link member forward for retracting said pin elements from said pockets when said slider element is slid along said rail assembly a preselected distance from said slider assembly spring.

17. The aircraft control panel assembly of claim 16, wherein said slider element comprises a front face aligned with a slider element access opening in said chassis assembly for access to the operator in depressing said slider element.

18. The aircraft control panel assembly of claim 17, wherein said slider element includes a depression formed in a spring engaging portion thereof for securing said slider assembly spring in a pin disengaged, retracted position,
   wherein said spring is manipulated via a spring access opening in said chassis assembly, the manipulation thereof providing disengagement of said slider assembly spring from said depression.

19. An aircraft control panel assembly for attachment to an equipment rail of an aircraft, comprising:
  a) a chassis assembly including at least one bore formed therein, said bore being at a first locking location;
  b) a retaining assembly, comprising:
   i. at least one spring loaded pin assembly positioned within a portion of said at least one bore of said chassis assembly, said pin assembly including a pin element and a spring element arranged and constructed to be positionable within a pocket of an equipment rail of said aircraft, a spring element of said pin assembly biasing said pin element toward said pocket;
   ii. a link member having a first end operably attached to said pin element; and,
   iii. a pin retraction mechanism comprising a slider assembly for manipulating said link member so as to retract said pin element from said pocket;
  c) at least one positioning element secured to said chassis at, at least one positioning location, said at least one positioning element being arranged and constructed to be positionable within a receiving slot of said equipment rail, wherein when said positioning element is positioned within said receiving slot of said equipment rail and wherein said pin element is engaged within said pocket of said equipment rail, said chassis is attached to said equipment rail; and,
  d) a visual indicator mechanism for indicating the open/closed state of said retaining assembly, said visual indicator mechanism, comprising:
   a sliding indicator securely fastened to said pin element, said sliding indicator being slidable over a window in said chassis assembly so as to allow a viewer to determine said open/closed state.

* * * * *